US006467017B1

(12) United States Patent
Ngai et al.

(10) Patent No.: US 6,467,017 B1
(45) Date of Patent: *Oct. 15, 2002

(54) PROGRAMMABLE LOGIC DEVICE HAVING EMBEDDED DUAL-PORT RANDOM ACCESS MEMORY CONFIGURABLE AS SINGLE-PORT MEMORY

(75) Inventors: Tony K. Ngai, Campbell; Rakesh H. Patel, Cupertino; Srinivas T. Reddy, Fremont; Richard G. Cliff, Milpitas, all of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 160 days.

(21) Appl. No.: 09/124,649

(22) Filed: Jul. 29, 1998

Related U.S. Application Data

(60) Provisional application No. 60/090,358, filed on Jun. 23, 1998.

(51) Int. Cl.[7] .............................................. G06F 12/00
(52) U.S. Cl. ........................................ 711/104; 326/39
(58) Field of Search .................................. 711/103, 104, 711/105, 170; 326/38, 39, 40, 41; 365/189.07, 189.04, 230.05

(56) References Cited

U.S. PATENT DOCUMENTS

| | | | |
|---|---|---|---|
| 4,293,783 A | 10/1981 | Patil | 307/465 |
| 4,642,487 A | 2/1987 | Carter | 307/465 |
| 4,706,216 A | 11/1987 | Carter | 365/94 |
| 4,758,985 A | 7/1988 | Carter | 365/94 |
| 4,825,414 A | 4/1989 | Kawata | 365/189 |
| 4,831,591 A | 5/1989 | Imazeki et al. | 365/189.08 |
| 4,855,958 A | 8/1989 | Ikeda | 365/230.08 |
| 4,870,302 A | 9/1989 | Freeman | 307/465 |
| 4,903,236 A | 2/1990 | Nakayama et al. | 365/185 |
| 4,963,770 A | 10/1990 | Keida | 307/465 |
| 4,975,601 A | 12/1990 | Steele | 307/465 |
| 5,042,004 A | 8/1991 | Agrawal et al. | 364/900 |
| 5,089,993 A | 2/1992 | Neal et al. | 365/63 |
| 5,099,150 A | 3/1992 | Steele | 307/465 |

(List continued on next page.)

FOREIGN PATENT DOCUMENTS

| | | |
|---|---|---|
| EP | 0 081 917 | 6/1983 |
| EP | 0 410 759 | 1/1991 |
| EP | 0 415 542 | 3/1991 |

(List continued on next page.)

OTHER PUBLICATIONS

Actel Corporation, "Integrator Series FPGAs—1200XL and 3200DX Families" data sheet Sep. 1997.

(List continued on next page.)

*Primary Examiner*—Matthew Kim
*Assistant Examiner*—Pierre-Michel Bataille
(74) *Attorney, Agent, or Firm*—Fish & Neave; Jeffrey H. Ingerman

(57) ABSTRACT

A programmable logic device has embedded random access memory ("RAM") that can function equally well in either single-port or dual-port operation. The RAM is dual-port RAM whose read address inputs and write address inputs are both connected to a conductor bus via two different sparsely populated programmable interconnection resources. The programmable interconnection resources are arranged so that each pair of corresponding read address and write address inputs can be connected to at least one conductor in common on the conductor bus, allowing the RAM to be configured to mimic a single-port RAM as read address signals and write address signals originating at remote components of the programmable logic device "think" they are being directed to the same address inputs.

12 Claims, 4 Drawing Sheets

U.S. PATENT DOCUMENTS

| | | | |
|---|---|---|---|
| 5,122,685 A | 6/1992 | Chan et al. | 307/465.1 |
| 5,128,559 A | 7/1992 | Steele | 307/465 |
| 5,138,577 A | 8/1992 | Oh | 365/189.05 |
| 5,144,582 A | 9/1992 | Steele | 365/189.08 |
| 5,212,652 A | 5/1993 | Agrawal et al. | 364/489 |
| RE34,444 E | 11/1993 | Kaplinsky | 340/825.8 |
| 5,258,668 A | 11/1993 | Cliff et al. | 307/465 |
| 5,260,610 A | 11/1993 | Pederson et al. | 307/465 |
| 5,260,611 A | 11/1993 | Cliff et al. | 307/465 |
| 5,291,444 A | 3/1994 | Scott et al. | 365/189.05 |
| 5,313,119 A | 5/1994 | Cook et al. | 307/465.1 |
| 5,315,178 A | 5/1994 | Snider | 307/465 |
| 5,329,460 A | 7/1994 | Agrawal et al. | 364/489 |
| 5,336,950 A | 8/1994 | Popli et al. | 307/465 |
| 5,343,406 A | 8/1994 | Freeman et al. | 364/490 |
| 5,349,250 A | 9/1994 | New | 307/465 |
| 5,352,940 A | 10/1994 | Watson | 307/465 |
| 5,408,434 A | 4/1995 | Stansfield | 365/189.08 |
| 5,414,377 A | 5/1995 | Freidin | 326/41 |
| 5,425,036 A | 6/1995 | Liu et al. | 371/23 |
| 5,426,378 A | 6/1995 | Ong | 326/39 |
| 5,436,575 A | 7/1995 | Pedersen et al. | 326/40 |
| 5,448,522 A | 9/1995 | Huang | 365/189.04 |
| 5,471,425 A | 11/1995 | Yumitori et al. | 365/190 |
| 5,550,782 A | 8/1996 | Cliff et al. | 365/230.03 |
| 5,566,123 A | 10/1996 | Freidin et al. | 365/230.05 |
| 5,715,197 A | 2/1998 | Nance et al. | 365/189.02 |
| 5,744,980 A * | 4/1998 | McGowan et al. | 326/40 |
| 5,804,986 A * | 9/1998 | Jones | 326/40 |
| 5,809,281 A | 9/1998 | Steele et al. | 395/497.01 |
| 5,835,405 A | 11/1998 | Tsui et al. | 365/182 |
| 5,933,023 A * | 8/1999 | Young | 326/40 |
| 5,977,791 A * | 11/1999 | Veenstra | 326/40 |
| 6,005,796 A * | 12/1999 | Sywyk et al. | 365/156 |
| 6,011,730 A * | 1/2000 | Sample et al. | 365/189.05 |
| 6,011,744 A | 1/2000 | Sample et al. | 365/230.03 |
| 6,020,759 A * | 2/2000 | Heile | 326/40 |
| 6,038,627 A * | 3/2000 | Plants | 326/37 |
| 6,049,223 A * | 4/2000 | Lytle et al. | 326/38 |
| 6,127,843 A * | 10/2000 | Agrawal et al. | 326/40 |
| 6,191,998 B1 * | 2/2001 | Reddy et al. | 365/230.05 |

FOREIGN PATENT DOCUMENTS

| | | |
|---|---|---|
| EP | 0 420 389 | 4/1991 |
| EP | 0 507 507 | 10/1992 |
| EP | 0 530 985 | 3/1993 |
| EP | 0 569 137 | 11/1993 |
| JP | 1-91525 | 4/1989 |
| JP | 1-91526 | 4/1989 |
| WO | WO9410754 | 5/1994 |
| WO | WO95/16993 | 6/1995 |

OTHER PUBLICATIONS

Lucent Technologies Inc., ORCA™OR2CxxA (5.0 V) and OR2TxxA (3.3 V) Series Field–Programmable Gate Arrays data sheet, Aug. 1996.

Xilinx, Inc., "XC4000E and XC4000X Series Filed Programmable Gate Arrays" data sheet, Version 1.4, Nov. 10, 1997.

*1999 Xilinx Databook*, 1999, Xilinx, Inc., San Jose, California.

"AT&T's Orthogonal ORCA Targets the FPGA Future," 8029 *Electronic Engineering*, 64, No. 786, Jun. 1992, pp. 9–10.

AT&T Microelectronics, "Optimized reconfigurable cell array (ORCA) series field–programmable gate arrays," pp. 1–87 (Advance Data Sheet, Feb. 1985).

Bursky, "Combination RAM/PLD Opens New Application Options," *Electronic Design*, May 23, 1991, pp. 138, 140.

Bursky, D., "Denser, Faster FPGAs Vie for Gate–Array Applications," 2328 *Electronic Design*, 41, No. 11, May 27, 1993, pp. 55–75.

Bursky, D., "FPGA Advances Cut Delays, Add Flexibility," 2328 *Electronic Design*, 40, No. 20, Oct. 1, 1992, pp. 35–43.

Bursky, D., "Shrink Systems with One–Chip Decoder, EPROM, and RAM," *Electronic Design*, Jul. 28, 1988, pp. 91–94.

Casselman, "Virtual Computing and The Virtual Computer," IEEE, Jul. 1993, p. 43.

Hsieh et al., "Third Generation Architecture Boosts Speed and Density of Field Programmable Gate Arrays," *Proc. of IEEE CICC Conf.*, May 1990, pp. 31.2.1 to 31.2.7.

Intel Preliminary Datasheet, "iFX780: 10ns FLEXlogic FPGA with SRAM Option," Nov. 1993, pp. 2–24 through 2–46.

Kautz, "Cellular Logic–in–Memory Arrays," *IEEE Trans. on Computers*, vol. C–18, No. 8, Aug. 1969, pp. 719–727.

Kawana, K. et al., "An Efficient Logic Block Interconnect Architecture for User–Reprogrammable Gate Array," *IEEE 1990 Custom Integrated Circuits Conf.*, May 1990, CH2860–5/90/0000–0164, pp. 31.3.1 to 31.3.4.

Landry, S., "Application–Specific ICs, Relying on RAM, Implement Almost Any Logic Function," *Electronic Design*, Oct. 31, 1985, pp. 123–130.

Larsson, T, "Programmable Logic Circuits: The Luxury Alternatives are Coming Soon," *Elteknik–med–Aktuell ElectroniK*, No. 4, Feb. 25–Mar. 9, 1988, pp. 37–38, (with English abstract).

Ling et al., "WASMII: A Data Driven Computer on a Virtual Hardware," *Proc. of IEEE Field Prog. Custom Computing Machines Conf.*, Napa, California, Apr. 1993, pp. 33–42.

Manning, "An Approach to Highly Integrated Computer Maintained Cellular Arrays," *IEEE Trans. on Computers*, vol. C–26, No. 6, Jun. 1977, pp. 536–552.

Masumoto, R.T., "Configurable On–Chip RAM Incorporated into High Speed Logic Array," *IEEE Custom Integrated Circuits Conference*, Jun. 1985, CH2157–6/85/000–0240, pp. 240–243.

Nagi, Kai–Kit Tony, "An SRAM–Programmable Field–Reconfigurable Memory," Presentation at University of Toronto, Canada, Jun. 1993, pp. 1–14.

Patil et al., "A Programmable Logic Approach for VLSI," *IEEE Trans. on Computers*, vol. C–28, No. 9, Sep. 1979, pp. 594–601.

Plus Logic "FPSL58110 Intelligent Data Buffer" Product Brief, Plus Logic, Inc., San Jose, California, Oct. 1990, pp. 1–6.

Quenot et al., "A Reconfigurable Compute engine for Real–Time Vision Automata Prototyping," *Proc. of IEEE FCCM Conf.*, Napa, California, Feb. 1994, pp. 91–100.

Quinnell, R.A., "FPGA Family Offers Speed, Density, On–Chip RAM, and Wide–Decode Logic," *EDN*, Dec. 6, 1990, pp. 62, 64.

Satoh, H. et al., "A 209–K–Transitor ECL Gate Array with RAM," *IEEE Jor. Solid–State Circuits*, vol. 24, No. 5, Oct. 1989, pp. 1275–1279.

Seitz, "Concurrent VLSI Architectures," *IEEE Trans. on Computers,* vol. C–33, No. 12, Dec. 1984, pp. 1247–1265.

Shubat, A. et al., "A Family of User–Programmable Peripherals with a Functional Unit Architecture," *IEEE Jor. of Solid–State Circuits,* vol. 27, No. 4, Apr. 1992, 0018–9200/92$03.00, pp. 515–529.

Smith, D., "Intel's FLEXlogic FPGA Architecture," IEEE 1063–6390/93, 1993 pp. 378–384.

Stone, "A Logic in Memory Computer," IEEE Trans. on Computers, Jan. 1970, pp. 73–78.

Xilinx, Inc. The Programmable Logic Data Book, 1993.

Xilinx, Inc., *The Programmable Logic Data Book,* pp. 2–5 through 2–102, 1994.

* cited by examiner

PROGRAMMABLE LOGIC DEVICE HAVING EMBEDDED DUAL-PORT RANDOM ACCESS MEMORY CONFIGURABLE AS SINGLE-PORT MEMORY

CROSS REFERENCE TO RELATED APPLICATION

This claims the benefit of commonly-assigned U.S. Provisional Application No. 60/090,358, filed Jun. 23, 1998.

BACKGROUND OF THE INVENTION

This invention relates to a programmable logic device having embedded random access memory. More particularly, this invention relates to such a programmable logic device in which the embedded random access memory is a dual-port memory that can be configured, using resources of the programmable logic device, as a single-port memory.

Programmable logic devices are well known. Such devices typically include a plurality of programmable logic cells or elements arranged on a single integrated circuit chip. A programmable interconnection structure allows a user, typically with the assistance of a dedicated software tool, to configure the device as any type of logic, within the capabilities of the device, that may be required. In order to facilitate the various configurations, the device typically is arranged as a two-dimensional array of logic cells or elements, and typically is provided with interconnection conductors that run vertically and horizontally within the array, although various ring configurations of conductors are also known. Depending on the design of the particular device, the conductors may run the length or breadth of the device, or may span only a portion of the device; many devices have combinations of conductors of various types. Whatever their type, conductors usually run in parallel groups or groups. The interconnection conductors are complemented by programmable interconnection resources that allow various conductors to be connected together and to particular inputs or outputs of the various logic cells or elements.

In early programmable logic devices, the programmable interconnection resources included fully populated matrices where interconnection conductors crossed, allowing any conductor in one group of interconnection conductors to be connected to any conductor in the intersecting group of interconnection conductors. As programmable logic devices became larger in size, it became impractical to provide such fully populated interconnections, because of the physical space they required on the integrated circuit chip. In current devices, it is common for most programmable interconnection resources to be less than fully populated. For example, in many cases, programmable interconnection resources are provided in the form of multiplexers. Using statistical techniques, based on likely user requirements, sufficient programmable interconnection resources are provided so that substantially any signal routing that a user might want to implement will be possible using some combination of interconnection conductors and programmable interconnection resources.

It has become common to provide on-board random access memory (RAM) as part of programmable logic devices. This particularly true in, but is not limited to, programmable logic devices whose logic elements are based on look-up tables implemented in static random access memory (SRAM). When RAM is provided on a programmable logic device, it may be configurable as logic elements, or it may be used to satisfy other memory requirements of the end user's logic configuration.

It is known to provide single-port RAM—i.e., RAM having a single port through which both read and write operations are conducted—on a programmable logic device. It is also known to combine two blocks of single-port RAM on a programmable logic device to emulate dual-port RAM—i.e., RAM having separate ports for reading and writing thereby allowing simultaneous read and write operations. One way of emulating dual-port RAM is to write all data to be stored in the RAM into both single-port RAM blocks, but to read from only one of the RAM blocks. This requires directing both addressing signals and data to be stored to both RAM blocks. An alternative approach is to use a single single-port RAM block to emulate a dual-port RAM by time-multiplexing read and write operations. However, this approach reduces by half the effective speed of the RAM. Using either approach, the various signals and data must be routed to the proper ports via the programmable interconnect structure of the programmable logic device.

It would be desirable to be able to provide a programmable logic device having embedded random access memory that can function equally well in either single-port or dual-port operation.

SUMMARY OF THE INVENTION

It is an object of the invention to provide a programmable logic device having embedded random access memory that can function equally well in either single-port or dual-port operation.

In accordance with the present invention, there is provided a programmable logic device having a plurality of logic resources, a plurality of groups of interconnection conductors for interconnecting the logic resources, and a plurality of programmable interconnection resources for connecting conductors in the groups of interconnection conductors to one another and to the plurality of logic resources, with the programmable interconnection resources being less than fully populated. The programmable logic device further includes at least one random access memory having a read port and a write port, a first programmable interconnection resource in the plurality of programmable interconnection resources for connecting port conductors in the read port to a selected one of the plurality of groups of interconnection conductors, and a second programmable interconnection resource in the plurality of programmable interconnection resources for connecting port conductors in the write port to the selected one of the plurality of groups of interconnection conductors. The first and second programmable interconnection resources are populated to allow connection of an individual conductor in the selected one of the plurality of groups of interconnection conductors to corresponding port conductors in both the read port and the write port.

The present invention achieves faster speeds for dual-port RAM in a programmable logic device by providing a true dual-port RAM. This eliminates the need to time-multiplex read and write operations, and therefore effectively doubles the speed available in previous programmable logic devices in which a single-port RAM was used with time-multiplexing of read and write operations on the same port. Alternatively, this eliminates the waste of using two RAMS to emulate a single RAM as described above.

When the dual-port RAM provided in accordance with the present invention is used in a programmable logic device of the type described above, each port must be connected to the interconnect structure of the programmable logic device so that signals can be sent to and received from the RAM. This presents potential difficulties, because, although in the present invention dual-port RAM is provided in a programmable logic device in the place of single-port RAM as previously known in programmable logic devices, there may be instances when the user's desired configuration requires the availability of single-port RAM. As described above, in many types of programmable logic devices the programmable interconnection resources are not fully populated. Thus, the port conductors in the read and write ports of a dual-port RAM provided in accordance with the present invention might not be connectable to the same group of conductors, and even if they are they might not be connectable to the same conductors within that group of conductors.

Therefore, in accordance with the present invention, both ports of the dual-port RAM are connected to programmable interconnection resources that connect them to the same group of conductors. Moreover, the programmable interconnection resources are populated in such a way that each pair of corresponding port conductors in the two ports can be connected the same individual conductor in the associated group of conductors.

Accordingly, if a user configuration of the programmable logic device requires the availability of single-port RAM, the programmable interconnection resources are configured so that corresponding read port conductors and write port conductors are connected to the same interconnection conductors of the programmable logic device. Then, in operation, the remainder of the circuit sends either a read address signal or a write address signal, as the case may be, to what it sees as a single destination just as it would with a standard single-port RAM. In fact, identical signals arrive at the two separate ports, but only the signals at one port are acted upon, in accordance with a read/write selection or enable signal that the circuit sends to enable either the read operation or the write operation of what it "thinks" is a single port. Thus, to the remainder of the programmable logic device, the dual-port RAM "looks" like a single-port RAM, using all of the same signals as a conventional single-port RAM.

According to a first preferred embodiment, the programmable interconnection resources for the read port and the write port are, at least with respect to the read and write ports, identically populated—i.e., the programmable interconnection resources are provided such that each port conductor in one of the ports can be connected to all of the same interconnection conductors to which the corresponding conductor in the other of the ports can be connected. It is not necessary according to this embodiment of the invention, however, for the programmable interconnection resources to be identically populated with respect to other interconnection conductors not used by either port, although such completely identical population of the programmable interconnection resources is within the present invention.

In a second preferred embodiment according to the invention, the programmable interconnection resources for the read port and the write port are not identically populated even with respect to the ports themselves. In this embodiment, each port conductor in one of the ports can be connected to at least one interconnection conductor to which the corresponding port conductor in the other of the ports can be connected, but corresponding port conductors might not share all of the same interconnection conductors.

Both of the aforementioned embodiments allow the dual-port RAM provided in accordance with the present invention to function as a single-port RAM by providing at least one combination of conductor assignments that allows identical address and control signals to reach both ports. The first embodiment allows more than one such possible set of conductor assignments, increasing flexibility in configuring the dual-port RAM of the device as single-port RAM, at possible expense of flexibility in configuring other functions of the overall programmable logic device. The second embodiment provides the reverse, allowing a smaller number, or perhaps only one, possible configuration of the dual-port RAM as a single-port RAM, but increasing flexibility in programming other functions of the overall programmable logic device.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
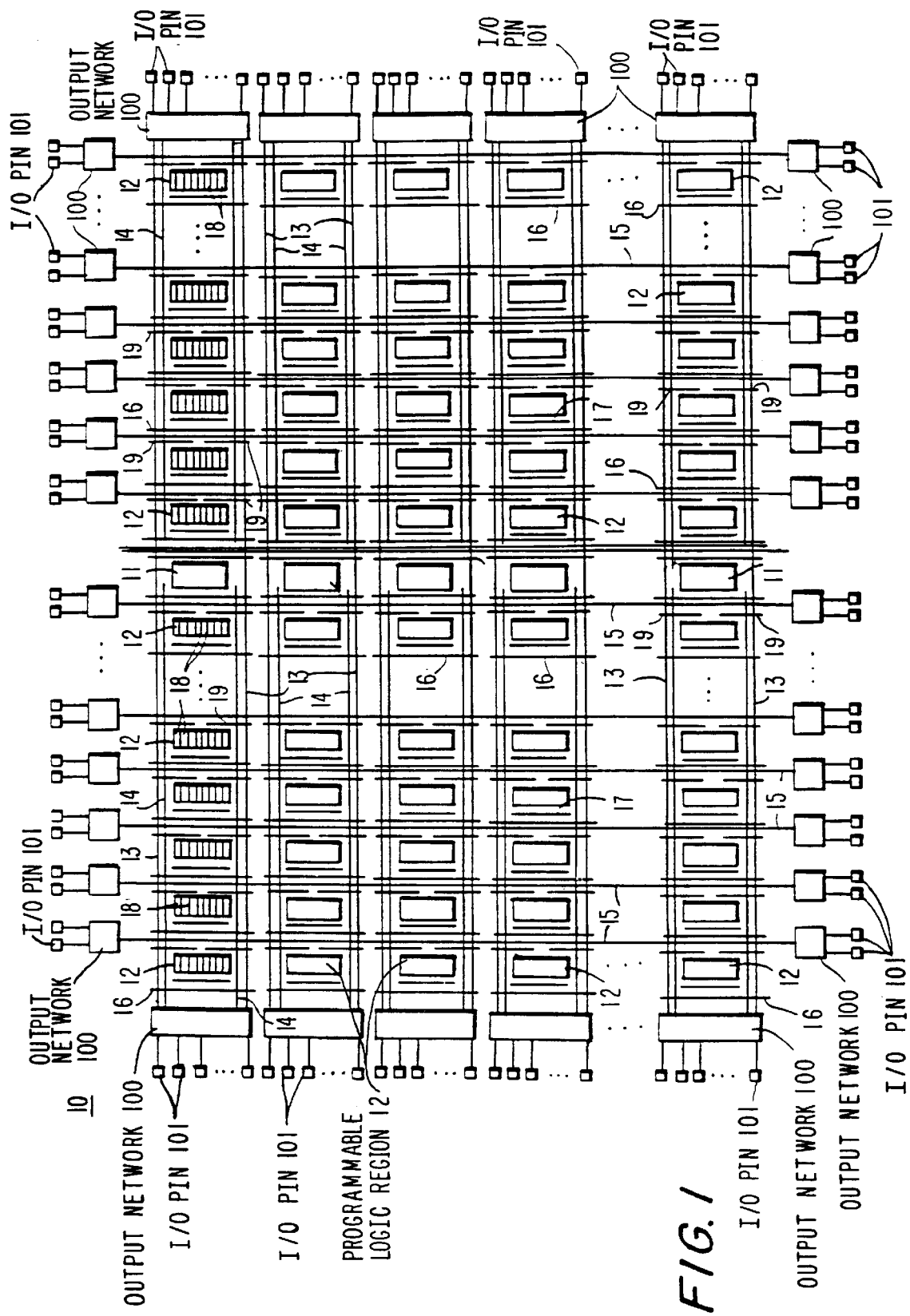
FIG. 1 is a high-level diagram of a programmable logic device including embedded dual-port random access memory configured according to the present invention.

FIG. 1 shows, as an example of a device in which the present invention can be used, a programmable logic device 10 having embedded random access memory. It should be recognized, however, that the present invention can be used with other types of programmable logic devices having random access memory embedded therein. For example, the invention could be used with programmable logic devices (not shown) similar to those described generally in Freeman U.S. Pat. Re. 34,363, which is also hereby incorporated by reference herein in its entirety.

As can be seen, device 10 has a plurality of random access memory arrays 11, which are arranged in one column on device 10. The remaining columns of device 10 are populated by programmable logic regions 12. Each row has two groups of horizontal interconnection conductors 13 that extend the entire length of the row, one group of conductors 13 being above the row and the other group being below the row. Conductors 13 are sometimes referred to as full-horizontal conductors or as global horizontal conductors. Each row also has four groups of horizontal interconnection conductors 14 that extend along half the length of the row. Two of these groups extend respectively along the top and bottom of the left half of the row. The other two groups of these conductors 14 extend respectively along the top and bottom of the right half of the row. The conductors 14 associated with each half of a row are preferably not directly connectable to the conductors 14 associated with the other half of the row. Conductors 14 are sometimes referred to as half-horizontal conductors. Each column of regular logic regions 12 has a group of vertical interconnection conductors 15 that extend continuously or substantially continuously along the entire length of the column.

In order to feed logic signals to each region 12, each regular logic region has an associated plurality of region feeding conductors 16 that can bring signals to the logic region from the horizontal conductors 13 and 14 associated with that region. Each region 12 also has eight associated local feedback conductors 17. Each conductor 17 makes the output signal of a respective one of the logic modules 18 in the associated region 12 available as an input to any of the other logic modules in that region without having to use any programmable interconnection resources that are not exclusively associated with the region.

Each region 12 also has output conductors 19 for conveying the output logic signals of the logic modules 18 in that region to the associated conductors 13 and 14. Programmable logic connectors ("PLCs") (not shown) are associated with each regular logic region 12 for making connections from the vertical (15) to the horizontal (13 and 14) conductors associated with the region. A plurality of output networks 100 connect the various conductors (13–15) to input/output pins 101.

Any one or more of random access memory arrays 11 can be a dual-port RAM configured according to the present invention. It is not required in accordance with the present invention that all random access memory arrays 11 provided in a programmable logic device be dual-port RAMs. However, the invention is most useful when there are no single-port RAMs provided in the device; when single-port RAMs are provided, there is little need to configure a dual-port RAM as a single-port RAM. By the same token, not all dual-port RAMs in a device need be configured in accordance with the invention, as long as enough so configured are available to satisfy the expected need by users to emulate single-port RAM.

Figure 2:
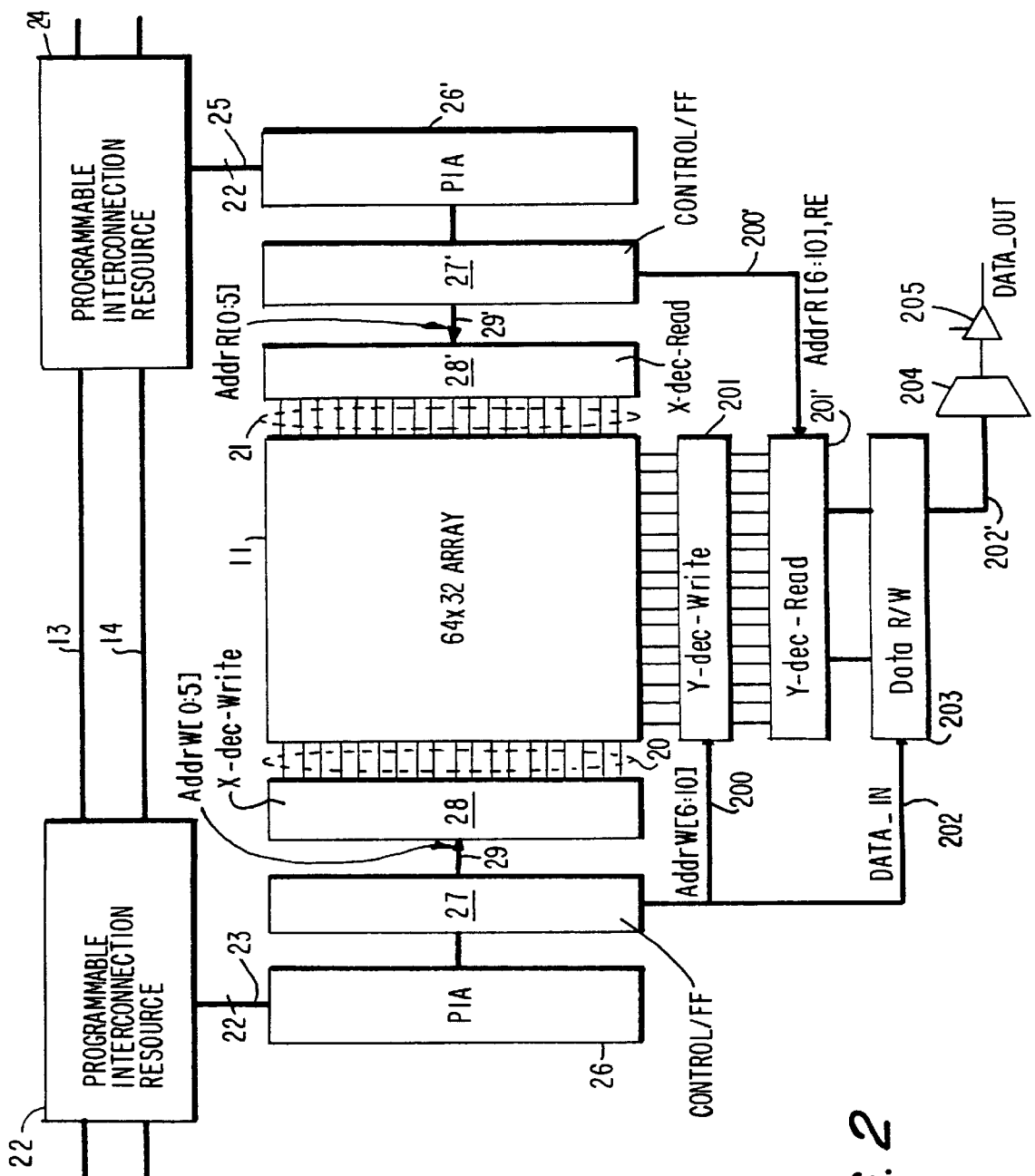
FIG. 2 is a block diagram of an example of a dual-port random access memory configured according to the present invention.

FIG. 2 shows in detail a preferred configuration of a dual-port RAM 11 according to the present invention. As shown, dual-port RAM 11 is a 64×32 random access memory array (although the present invention could be used to equal advantage with RAM arrays of substantially any size) having write port 20 to the left and read port 21 to the right, located below groups 13, 14 of horizontal interconnection conductors. In one preferred embodiment, groups 13, 14 might encompass, between them, about 200 conductors, which could be thought of collectively as a conductor bus.

In the embodiment shown in FIG. 2, twenty-two write port conductors 23 are connected to horizontal conductors 13, 14 by programmable interconnection resource 22, while twenty-two read port conductors 25 are connected to horizontal conductors 13, 14 by programmable interconnection resource 24. Programmable interconnection resources 22, 24 are preferably less than fully populated interconnection matrices or multiplexers, or similar structures, as are well known in programmable logic devices.

Write port conductors 23 pass through a first programmable interconnect array ("PIA") 26 to a first control/flip-flop block 27 which includes control logic (not shown) of a type that is well known for directing write address signals and write data to the appropriate inputs of RAM 11, as well as one or more flip-flops to register the write address signals and/or data for synchronous writing as controlled by clock and/or enable signals. The clock and enable signals may be provided on conductors 23 or on other conductors (not shown) that provide those signals device-wide.

Control/flip-flop block 27 directs write address row signals 29 to write address row decoder 28. For the 64-row array 11 shown in FIG. 2, write address row signals 29 include six bits ($2^6$=64). Similarly, control/flip-flop block 27 directs write address column signals 200 to write address column decoder 201. For the 32-column array 11 shown in FIG. 2, write address column signals 200 include five bits ($2^5$=32). Control/flip-flop block 27 also directs write data signals 202 to read/write data buffer 203.

Read port conductors 25 pass through a second programmable interconnect array ("PIA") 26' to a second control/flip-flop block 27' which includes control logic (not shown), similar to that of block 27, of a type that is well known for directing read address signals to the appropriate inputs of RAM 11, and registering those signals for synchronous operation as required.

Control/flip-flop block 27' directs read address row signals 29' to read address row decoder 28'. For the 64-row array 11 shown in FIG. 2, read address row signals 29' include six bits ($2^6$=64). Similarly, control/flip-flop block 27' directs read address column signals 200' to read address column decoder 201'. For the 32-column array 11 shown in FIG. 2, read address column signals 200' include five bits ($2^5$=32). Signals 200' preferably also include a read-enable signal which controls whether read port 21 is activated. If the read-enable signal is high, read data signals 202' preferably are selected by multiplexer 204 and buffered by tristate device 205 and routed to the desired destination through the programmable interconnect structure of device 10.

When RAM array 11 is to be used as a single-port RAM, the user's configuration will send read address signals and write address signals to what appears, according to that configuration, to be a single destination. In fact, of course, write address signals must arrive at write port 20, while read address signals must arrive at read port 21. Therefore, because both read address signals and write address signals are sent along the same ones of conductors 13, 14 (because the user configuration "thinks" the signals go to the same place), corresponding read port conductors and write port conductors must be able to be connected to the same ones of conductors 13, 14. For example, if the seventeenth one of write port conductors 23 can be connected to the 103rd, the 156th and the 192nd ones of conductors 13, 14, then the seventeenth one of read port conductors 25 must be able to be connected to at least one of the 103rd, the 156th and the 192nd ones of conductors 13, 14 in order for device 10 to be able to be configured for RAM array 11 to be used as a single-port RAM. This is accomplished in accordance with the invention by arranging the available pattern of connections when constructing the less than fully populated programmable interconnection resources 22, 24 to assure that the necessary connections are available.

As set forth above, programmable interconnection resources 22, 24 can be constructed so that the available interconnections for write conductors 23 and read conductors 25 vis-a-vis conductors 13, 14 are identical, to provide multiple combinations for single-port emulation, or so that the available interconnections merely overlap to provide at least one combination for single-port emulation. These two alternatives are illustrated schematically in FIGS. 3A and 3B.

Figure 3A:
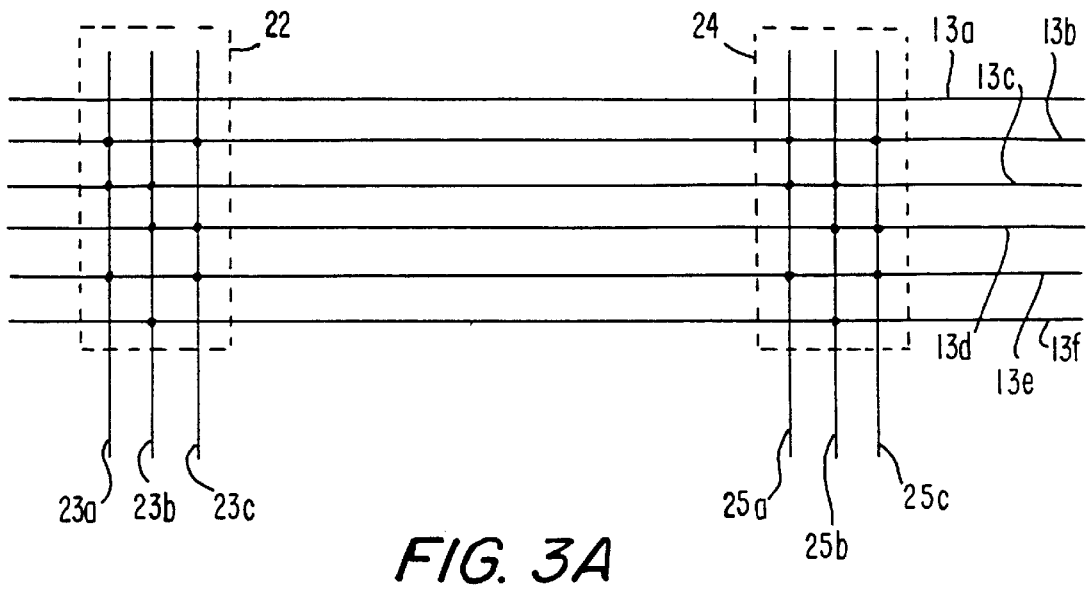
FIGS. 3A and 3B are schematic representations of possible arrangements of the programmable interconnection resources of FIG. 2.

FIG. 3A shows schematically the first alternative, in which programmable interconnection resources 22, 24 are identically populated, at least as far as the intersections of interconnection conductors 13, 14 with port conductors 23, 25 are concerned (i.e., there may be other interconnections within those programmable interconnection resources that are not shown). In FIG. 3A, interconnection conductors 13, 14 are represented by the six individual conductors 13a, 13b, 13c, 13d, 13e and 13f, while port conductors 23, 25 are represented by individual conductors 23a, 23b and 23c, and 25a, 25b and 25c, respectively.

In this embodiment, in an arrangement shown for illustrative purposes only, within programmable interconnection resource 22, conductor 23a can be connected to any of conductors 13b, 13c or 13e, conductor 23b can be connected to any of conductors 13c, 13d or 13f, and conductor 23c can be connected to any one of conductors 13b, 13d or 13e. Programmable interconnection resource 24 is identically populated with respect to the intersection of interconnection conductors 13, 14 with port conductors 25. Thus, within programmable interconnection resource 24, conductor 25a, corresponding to conductor 23a, can be connected to any of conductors 13b, 13c or 13e; conductor 25b, corresponding to conductor 23b, can be connected to any of conductors 13c, 13d or 13f; and conductor 25c, corresponding to conductor 23c, can be connected to any one of conductors 13b, 13d or 13e.

Figure 3B:
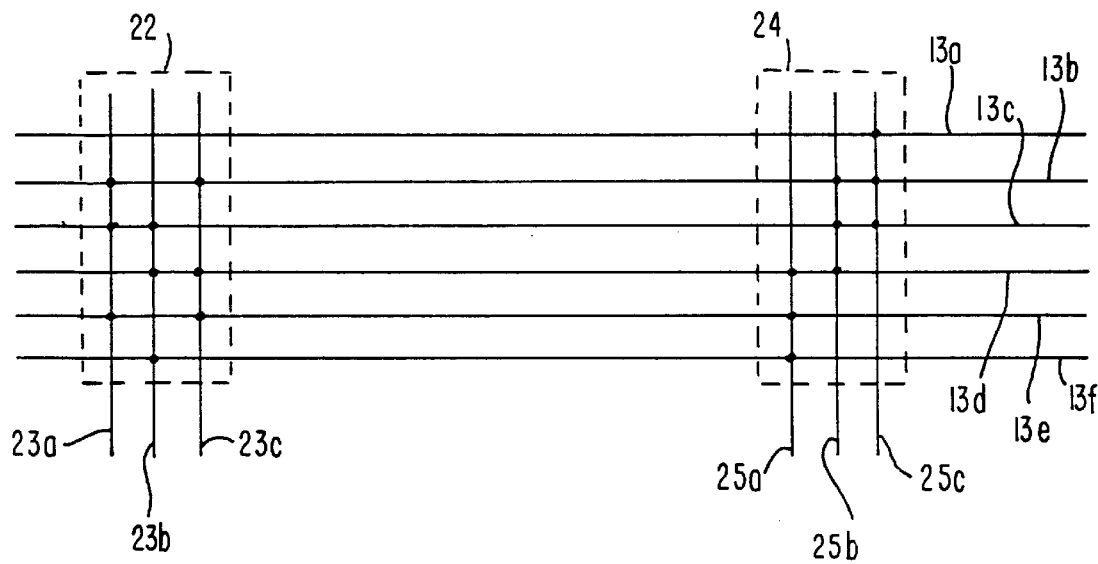

FIG. 3B shows schematically the second alternative, in which programmable interconnection resources 22, 24 are not identically populated, but, at least as far as the intersections of interconnection conductors 13, 14 with port conductors 23, 25 are concerned (i.e., there may be other interconnections within those programmable interconnection resources that are not shown), merely have overlapping populations of available interconnections. In FIG. 3B, as in FIG. 3A, interconnection conductors 13, 14 are represented by the six individual conductors 13a, 13b, 13c, 13d, 13e and 13f, while port conductors 23, 25 are represented by individual conductors 23a, 23b and 23c, and 25a, 25b and 25c, respectively.

In this embodiment, in an arrangement shown for illustrative purposes only, within programmable interconnection resource 22, conductor 23a can be connected to any of conductors 13b, 13c or 13e, conductor 23b can be connected to any of conductors 13c, 13d or 13f, and conductor 23c can be connected to any one of conductors 13b, 13d or 13e. Within programmable interconnection resource 24, conductor 25a, corresponding to conductor 23a, can be connected to any of conductors 13d, 13e or 13f; conductor 25b, corresponding to conductor 23b, can be connected to any of conductors 13b, 13c or 13d; and conductor 25c, corresponding to conductor 23c, can be connected to any one of conductors 13a, 13b or 13c. Thus, corresponding-port conductors 23a and 25a have only one available connection in common to interconnection conductor 13e, corresponding port conductors 23b and 25b have two available connections in common to interconnection conductors 13c and 13d, and corresponding port conductors 23c and 25c have only one available connection in common to interconnection conductor 13b.

It should be noted that the "interiors" of programmable interconnection resources 22, 24 as shown in FIGS. 3A, 3B are schematic only, and programmable interconnection resources 22, 24 may be constructed using any new or previously known structure for achieving such connections.

Figure 4:
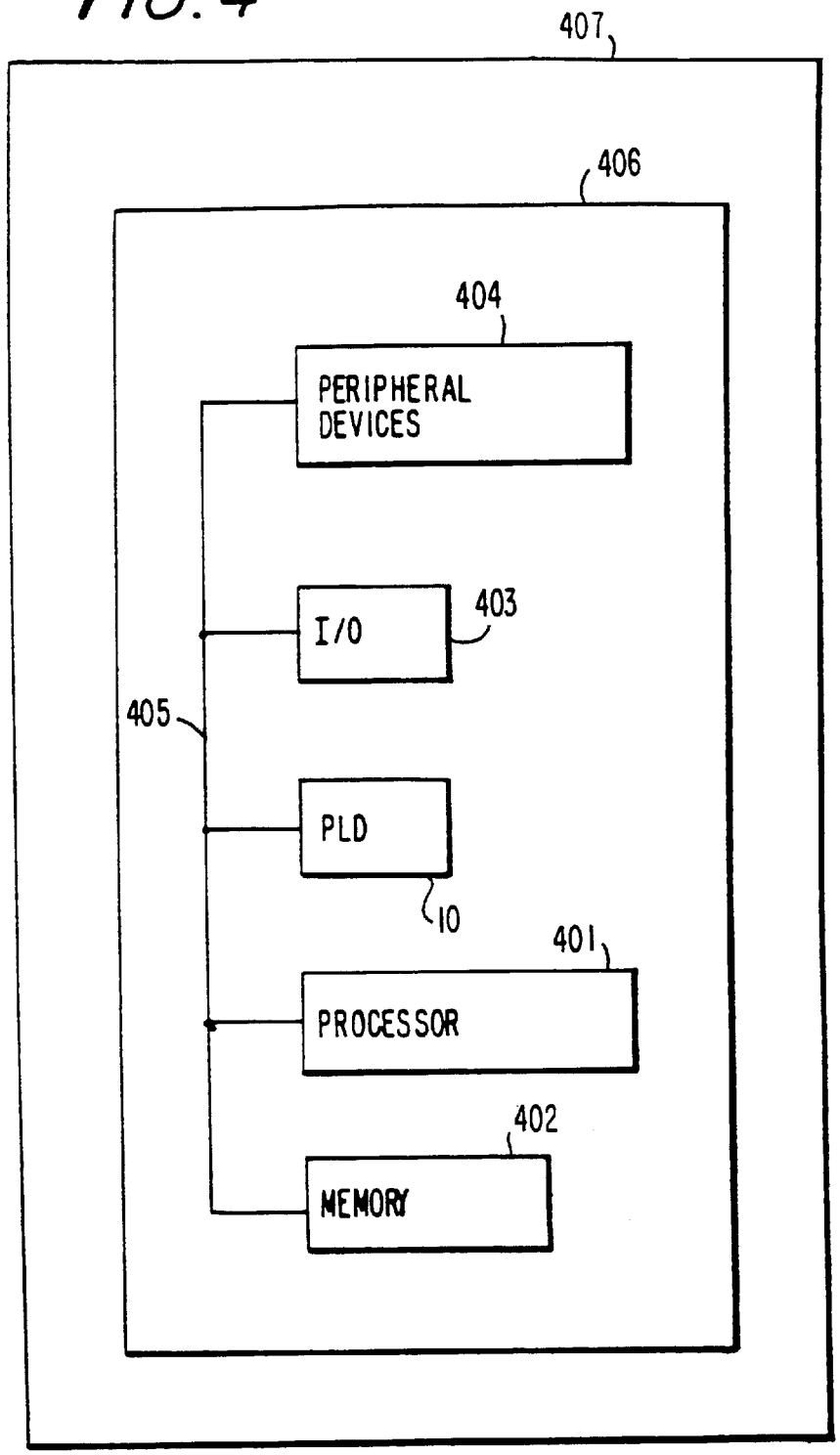
FIG. 4 is a simplified block diagram of an illustrative system employing a programmable logic device incorporating dual-port random access memory configured in accordance with the invention.

FIG. 4 illustrates a programmable logic device 10 incorporating RAM arrays 11 configured according to this invention in a data processing system 400. Data processing system 400 may include one or more of the following components: a processor 401; memory 402; I/O circuitry 403; and peripheral devices 404. These components are coupled together by a system bus 405 and are populated on a circuit board 406 which is contained in an end-user system 407.

System 400 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or.controller that works in cooperation with processor 401. Programmable logic device 10 may also be used as an arbiter for arbitrating access to a shared resource in system 400. In yet another example, programmable logic device 10 can be configured as an interface between processor 401 and one of the other components in system 400. It should be noted that system 400 is only exemplary, and that the true scope and spirit of the invention should be indicated by the following claims.

Various technologies can be used to implement programmable logic devices 10 employing the RAM arrays 11 configured according to this invention, as well as the various components of those RAM arrays. Moreover, this invention is applicable to both one-time-only programmable and reprogrammable devices.

Thus it is seen that a programmable logic device having embedded random access memory that can function equally well in either single-port or dual-port operation is provided. One skilled in the art will appreciate that the present invention can be practiced by other than the described embodiments, which are presented for purposes of illustration and not of limitation, and the present invention is limited only by the claims which follow.

What is claimed is:

1. A programmable logic device comprising:
   a plurality of logic resources;
   a plurality of groups of interconnection conductors for interconnecting said logic resources; and
   a plurality of programmable interconnection resources for connecting conductors in said groups of interconnection conductors to one another and to said plurality of logic resources, said programmable interconnection resources being less than fully populated; said programmable logic device further comprising:
   at least one random access memory having a read port and a write port;
   a first programmable interconnection resource in said plurality of programmable interconnection resources for connecting port conductors in said read port to a selected one of said plurality of groups of interconnection conductors; and
   a second programmable interconnection resource in said plurality of programmable interconnection resources for connecting port conductors in said write port to said selected one of said plurality of groups of interconnection conductors; wherein:
   said read port has a first number of read port conductors;
   said write port has a second number of write port conductors;
   said first number is equal to said second number, each read port conductor in said read port having a corresponding write port conductor in said write port; and
   said first and second programmable interconnection resources are populated to allow connection of each individual conductor in said selected one of said plurality of groups of interconnection conductors to an individual read port conductor in said read port and to an individual write port conductor, corresponding to said individual read port conductor, in said write port.

2. The programmable logic device of claim 1 wherein said first and second programmable interconnection resources are identically populated.

3. A digital processing system comprising:

processing circuitry;

a system memory coupled to said processing circuitry; and coupled to the processing circuitry and the system memory, a programmable logic device comprising:
  a plurality of logic resources,
  a plurality of groups of interconnection conductors for interconnecting said logic resources, and
  a plurality of programmable interconnection resources for connecting conductors in said groups of interconnection conductors to one another and to said plurality of logic resources, said programmable interconnection resources being less than fully populated, said programmable logic device further comprising:
    at least one random access memory having a read port and a write port,
    a first programmable interconnection resource in said plurality of programmable interconnection resources for connecting port conductors in said read port to a selected one of said plurality of groups of interconnection conductors, and
    a second programmable interconnection resource in said plurality of programmable interconnection resources for connecting port conductors in said write port to said selected one of said plurality of groups of interconnection conductors, wherein:
      said first and second programmable interconnection resources are populated to allow connection of an individual conductor in said selected one of said plurality of groups of interconnection conductors to corresponding port conductors in both said read port and said write port.

4. A printed circuit board on which is mounted a programmable logic device, said programmable logic device comprising:
  a plurality of logic resources;
  a plurality of groups of interconnection conductors for interconnecting said logic resources; and
  a plurality of programmable interconnection resources for connecting conductors in said groups of interconnection conductors to one another and to said plurality of logic resources, said programmable interconnection resources being less than fully populated; said programmable logic device further comprising:
    at least one random access memory having a read port and a write port;
    a first programmable interconnection resource in said plurality of programmable interconnection resources for connecting port conductors in said read port to a selected one of said plurality of groups of interconnection conductors; and
    a second programmable interconnection resource in said plurality of programmable interconnection resources for connecting port conductors in said write port to said selected one of said plurality of groups of interconnection conductors; wherein:
      said first and second programmable interconnection resources are populated to allow connection of an individual conductor in said selected one of said plurality of groups of interconnection conductors to corresponding port conductors in both said read port and said write port.

5. The printed circuit board defined in claim 4 further comprising:
  a board memory mounted on the printed circuit board and coupled to the programmable logic device.

6. The printed circuit board defined in claim 5 further comprising:
  processing circuitry mounted on the printed circuit board and coupled to the board memory.

7. An integrated circuit comprising:
  a plurality of semiconductor devices;
  a plurality of groups of interconnection conductors for interconnecting said semiconductor devices; and
  a plurality of programmable interconnection resources for connecting conductors in said groups of interconnection conductors to one another and to said plurality of semiconductor devices, said programmable interconnection resources being less than fully populated; said integrated circuit further comprising:
    at least one random access memory having a read port and a write port;
    a first programmable interconnection resource in said plurality of programmable interconnection resources for connecting port conductors in said read port to conductors in a selected one of said plurality of groups of interconnection conductors; and
    a second programmable interconnection resource in said plurality of programmable interconnection resources for connecting port conductors in said write port to conductors in said selected one of said plurality of groups of interconnection conductors; wherein:
      said read port has a first number of read port conductors;
      said write port has a second number of write port conductors;
      said first number is equal to said second number, each read port conductor in said read port having a corresponding write port conductor in said write port; and
      said first and second programmable interconnection resources are populated to allow connection of each individual conductor in said selected one of said plurality of groups of interconnection conductors to an individual read port conductor in said read port and to an individual write port conductor, corresponding to said individual read port conductor, in said write port.

8. The integrated circuit of claim 7 wherein said first and second programmable interconnection resources are identically populated.

9. A digital processing system comprising:

processing circuitry;

a system memory coupled to said processing circuitry; and coupled to the processing circuitry and the system memory, an integrated circuit comprising:
  a plurality of semiconductor devices,
  a plurality of groups of interconnection conductors for interconnecting said semiconductor devices, and
  a plurality of programmable interconnection resources for connecting conductors in said groups of interconnection conductors to one another and to said plurality of semiconductor devices, said programmable interconnection resources being less than fully populated, said integrated circuit further comprising:

at least one random access memory having a read port and a write port, a first programmable interconnection resource in said plurality of programmable interconnection resources for connecting port conductors in said read port to conductors in a selected one of said plurality of groups of interconnection conductors, and a second programmable interconnection resource in said plurality of programmable interconnection resources for connecting port conductors in said write port to conductors in said selected one of said plurality of groups of interconnection conductors, wherein:

said first and second programmable interconnection resources are populated to allow connection of an individual conductor in said selected one of said plurality of groups of interconnection conductors to corresponding port conductors in both said read port and said write port.

10. A printed circuit board on which is mounted an integrated circuit, said integrated circuit comprising:

a plurality of semiconductor devices;

a plurality of groups of interconnection conductors for interconnecting said semiconductor devices; and a plurality of programmable interconnection resources for connecting conductors in said groups of interconnection conductors to one another and to said plurality of semiconductor devices, said programmable interconnection resources being less than fully populated; said integrated circuit further comprising:

at least one random access memory having a read port and a write port;

a first programmable interconnection resource in said plurality of programmable interconnection resources for connecting port conductors in said read port to conductors in a selected one of said plurality of groups of interconnection conductors; and a second programmable interconnection resource in said plurality of programmable interconnection resources for connecting port conductors in said write port to conductors in said selected one of said plurality of groups of interconnection conductors; wherein:

said first and second programmable interconnection resources are populated to allow connection of an individual conductor in said selected one of said plurality of groups of interconnection conductors to corresponding port conductors in both said read port and said write port.

11. The printed circuit board defined in claim 10 further comprising:

a board memory mounted on the printed circuit board and coupled to the integrated circuit.

12. The printed circuit board defined in claim 11 further comprising:

processing circuitry mounted on the printed circuit board and coupled to the board memory.

* * * * *